(12) United States Patent
Chern et al.

(10) Patent No.: US 7,292,458 B1
(45) Date of Patent: Nov. 6, 2007

(54) CIRCUIT BOARD ASSEMBLY HAVING A SET OF EDGE CLIPS FOR CONNECTING MULTIPLE BOARDS TOGETHER

(75) Inventors: Michael Chern, San Jose, CA (US); Saeed Seyed, Los Altos Hills, CA (US); Phillip Ting, San Jose, CA (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 11/291,229

(22) Filed: Dec. 1, 2005

(51) Int. Cl.
*H05K 7/02* (2006.01)

(52) U.S. Cl. ............... 361/807; 361/759; 361/785; 361/790; 361/754; 361/774; 174/138 D; 174/250; 108/152; 439/74; 439/567

(58) Field of Classification Search .......... 361/759, 361/785, 790, 792, 754, 774, 807; 174/250, 174/138 D; 108/152; 439/74, 567
See application file for complete search history.

(56) References Cited

U.S. PATENT DOCUMENTS

| | | | | |
|---|---|---|---|---|
| 4,601,247 A | * | 7/1986 | Welch et al. | ............ 108/152 |
| 5,038,985 A | * | 8/1991 | Chapin | ........................ 224/669 |
| 5,477,619 A | * | 12/1995 | Kearns | ........................ 33/668 |
| 5,910,885 A | * | 6/1999 | Gulachenski et al. | ........ 361/774 |
| 6,321,418 B1 | * | 11/2001 | Halleck | ...................... 24/3.12 |
| 6,430,052 B1 | | 8/2002 | Kordes et al. | .............. 361/719 |
| 6,478,604 B1 | | 11/2002 | Downes et al. | .............. 439/400 |
| 6,716,072 B1 | | 4/2004 | Downes | ........................ 439/876 |
| 6,726,505 B2 | * | 4/2004 | Cermak et al. | ............. 439/567 |
| 6,773,269 B1 | | 8/2004 | Downes | ........................ 439/75 |
| 6,853,556 B1 | * | 2/2005 | Myers et al. | ................ 361/754 |
| 6,951,466 B2 | * | 10/2005 | Sandoval et al. | ............. 439/74 |
| 7,085,141 B2 | | 8/2006 | Yi | .............................. 361/804 |
| 2005/0048812 A1 | * | 3/2005 | Sandoval et al. | ............. 439/74 |
| 2006/0230627 A1 | * | 10/2006 | Blackman et al. | ............ 33/761 |

* cited by examiner

*Primary Examiner*—Dean A. Reichard
*Assistant Examiner*—Xiaoliang Chen
(74) *Attorney, Agent, or Firm*—BainwoodHuang

(57) ABSTRACT

A circuit board assembly includes a motherboard defining a motherboard plane, and a daughter board defining a daughter board plane which is substantially parallel to the motherboard plane. The motherboard and the daughter board electrically connect to each other through a set of circuit board connectors. The circuit board assembly further includes a set of edge clips. Each edge clip extends outwardly from the daughter board along the daughter board plane and is configured to operate as a mounting platform through which to physically secure the daughter board to the motherboard.

19 Claims, 8 Drawing Sheets

US 7,292,458 B1

CIRCUIT BOARD ASSEMBLY HAVING A SET OF EDGE CLIPS FOR CONNECTING MULTIPLE BOARDS TOGETHER

BACKGROUND

In some situations, a customer of an electronic system may be able to upgrade the electronic system by adding a circuit board. The additional circuit board may add functionality, or increase the processing power or bandwidth of the electronic system. In one conventional situation, an electronic system includes multiple circuit board modules which connect to a backplane or midplane through a card cage that holds the circuit board modules in a side-by-side manner. Each circuit board module includes (i) a main circuit board, (ii) a daughter card which mounts to one side of the main circuit board, and (iii) a metallic tray which mounts to the opposite side of the main circuit board for EMI shielding purposes.

When a customer is ready to upgrade a circuit board module of the electronic system, the manufacturer ships a supplemental card to the customer. The customer then disconnects the daughter card from the main circuit board, attaches the supplemental card to the main circuit board and then reattaches the daughter card to the main circuit board with the daughter card and the supplemental card connecting to the same side of the main circuit board. As a result, the upgraded circuit board module now includes the main circuit board, the daughter card and the new supplemental card. The distance between the supplemental card and the main circuit board is smaller than the distance between daughter card and the main circuit board.

It should be understood that, in the upgraded situation, the supplemental card is in an advantageous location relative to the main circuit board due to physical constraints of the electronic system; In particular, in its current location, the supplemental card properly fits relative to both the main circuit board and the daughter card while enabling satisfactory cooling of the components of all three boards. Additionally, the supplement card is unable to mount to the other side of the main circuit board (i.e., the side opposite the daughter card) due to the presence of the metallic tray on that other side. Furthermore, the supplemental card is unable to mount to above the daughter card (i.e., on the same side of the main circuit board as the daughter card but further away from the main circuit board than the daughter card) due to space limitations between neighboring circuit board modules within the card cage.

SUMMARY

Unfortunately, there are deficiencies to the above-described conventional electronic system. For example, it may be extremely undesirable for the customer to disconnect the daughter card from the main circuit board and later reattach the daughter card to the main circuit board if the daughter card and the main circuit board connect to each other using expensive connectors which connect in a blind mating manner where the daughter card and the main circuit board connect by moving toward each other face to face. In such a situation, the customer who may be untrained at reattaching the daughter card to the main circuit board may inadvertently damage one or both of the boards. For instance, the customer may bend connector pins, overstress the solder joints of a circuit board component, unseat a heat sink, and so on.

In contrast to the above-described conventional approaches to upgrading a module of an electronic system, an improved circuit board assembly utilizes a set of edge clips which extend outwardly from a daughter board connected to a motherboard. The set of edge clips enable a user to connect a new circuit board to the motherboard on the same side as the daughter board without removing the daughter board even if the distance from the new circuit board to the motherboard is smaller than the distance from the daughter board to the motherboard. Accordingly, there is no need to disconnect the daughter board from the motherboard and then reattach the daughter board to the motherboard which could otherwise run the risk of damaging one or both of the boards. Rather, during installation of the new circuit board onto the motherboard, the daughter board can remain connected through circuit board connectors at all times.

One embodiment is directed to a circuit board assembly which includes a motherboard defining a motherboard plane, and a daughter board defining a daughter board plane which is substantially parallel to the motherboard plane. The motherboard and the daughter board electrically connect to each other through a set of circuit board connectors. The circuit board assembly further includes a set of edge clips. Each edge clip extends outwardly from the daughter board along the daughter board plane and is configured to operate as a mounting platform through which to physically secure the daughter board to the motherboard.

BRIEF DESCRIPTION OF THE DRAWINGS

The foregoing and other objects, features and advantages of the invention will be apparent from the following description of particular embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION

An improved circuit board assembly utilizes a set of edge clips which extend outwardly from a daughter board connected to a motherboard. The set of edge clips enable a user to connect a new circuit board to the motherboard on the same side as the daughter board without removing the daughter board even if the distance from the new circuit board to the motherboard is smaller than the distance from the daughter board to the motherboard. Accordingly, there is no need to disconnect the daughter board from the motherboard and then reconnect the daughter board to the motherboard which could otherwise run the risk of damaging one or both of the boards. Rather, during installation of the new circuit board onto the motherboard, the daughter board can remain connected at all times using circuit board connectors.

Figure 1:
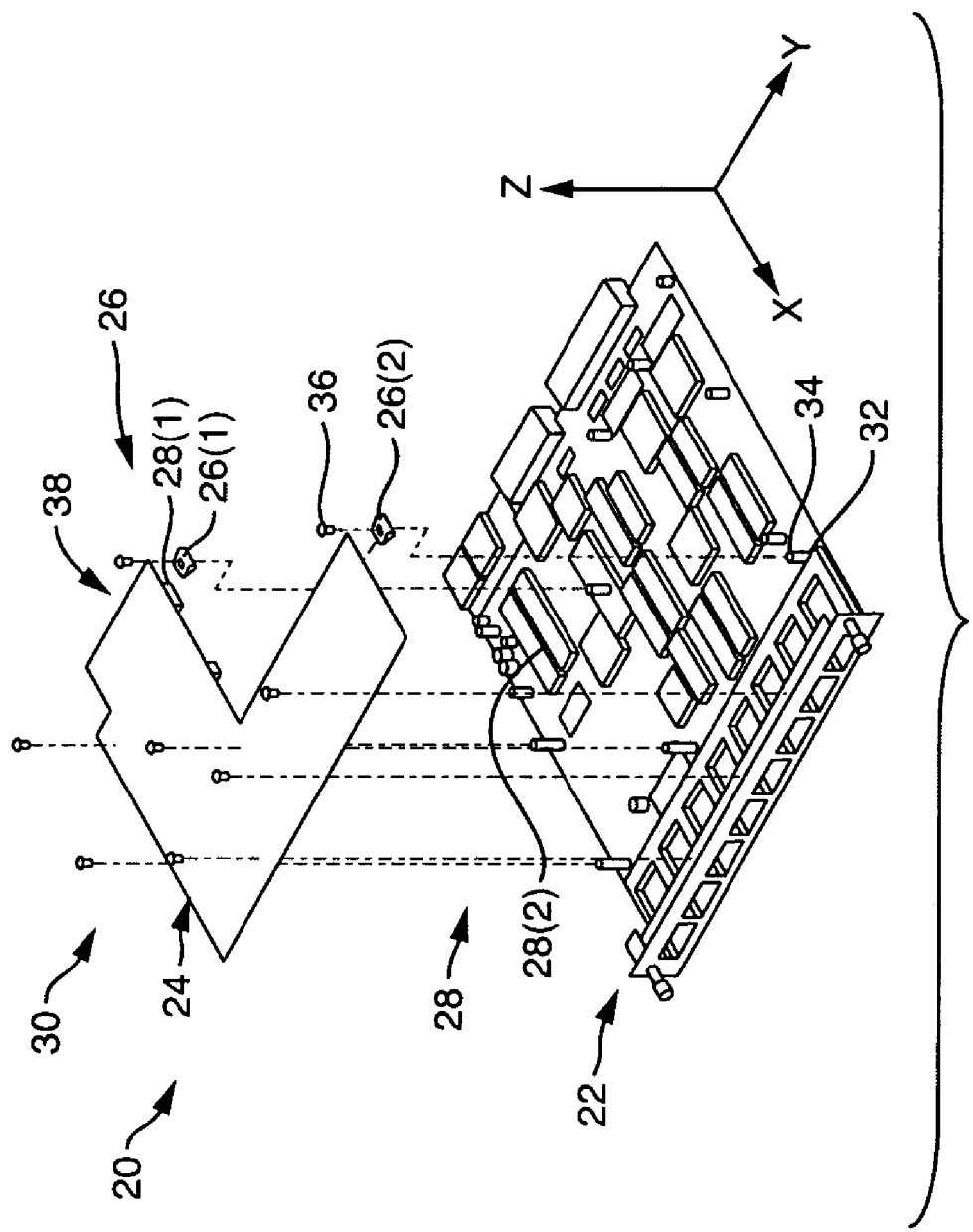
FIG. 1 is an exploded view of an electronic system which includes a set of edge clips for connecting multiple circuit boards together.

FIG. 1 shows a circuit board assembly 20 which utilizes a set of edge clips to connect multiple circuit boards together. Each edge clip operates as a mounting platform (e.g., a removable extension of a circuit board) which facilitates attachment of a first circuit board to a second circuit board using hardware.

As shown in FIG. 1, the circuit board assembly 20 includes a motherboard 22, a daughter board 24, and a set of edge clips 26. The motherboard 22 defines a motherboard plane, and similarly the daughter board 24 defines a daughter board plane which is substantially parallel to the motherboard plane, i.e., both X-Y planes. The daughter board 24 includes a circuit board connector 28(1) (shown generally by the arrow 28(1) in FIG. 1). Similarly, the motherboard 22 includes a circuit board connector 28(2).

When the circuit board assembly 20 is in assembled form, the motherboard 22 and the daughter board 24 are configured to electrically connect through the circuit board connectors 28(1), 28(2) (collectively, circuit board connectors 28). In particular, the connectors are configured to engage each other when the daughter board 24 and the motherboard 22 move toward each other along the vertical axis in FIG. 1, i.e., the Z-axis, which is substantially perpendicular to the motherboard and daughter board planes, i.e., X-Y planes.

As further shown in FIG. 1, the set of edge clips 26 includes a first edge clip 26(1) and a second edge clip 26(2). When properly installed, each edge clip 26 extends outwardly from the daughter board 24 along the daughter board plane and is configured to operate as a mounting platform through which to physically secure the daughter board 24 to the motherboard 22. That is, mounting hardware 30 then fastens the edge clips 26 to the motherboard 22. Along these lines, standoffs 32, spacers 34 and screws 36 participate in mounting the daughter board 24 to the motherboard 22. In particular, a screw 36 passes through an edge clip 26, a spacer 34 and a standoff 32 when attaching the edge clip 26(1) and an outer edge 38 of the daughter board 24 to the motherboard 22. Similarly, another screw 36 passes through another edge clip 26, another spacer 34 and another standoff 32 when attaching the edge clip 26(2) and the outer edge 38 of the daughter board 24 to the motherboard 22. The standoffs 32 and the spacers 34 define a preset separation distance between the motherboard 22 and the daughter board 24 (e.g., 1.5 inches, 2.0 inches, etc.). Further details will now be provided with reference to FIGS. 2 through 6.

Figure 2:
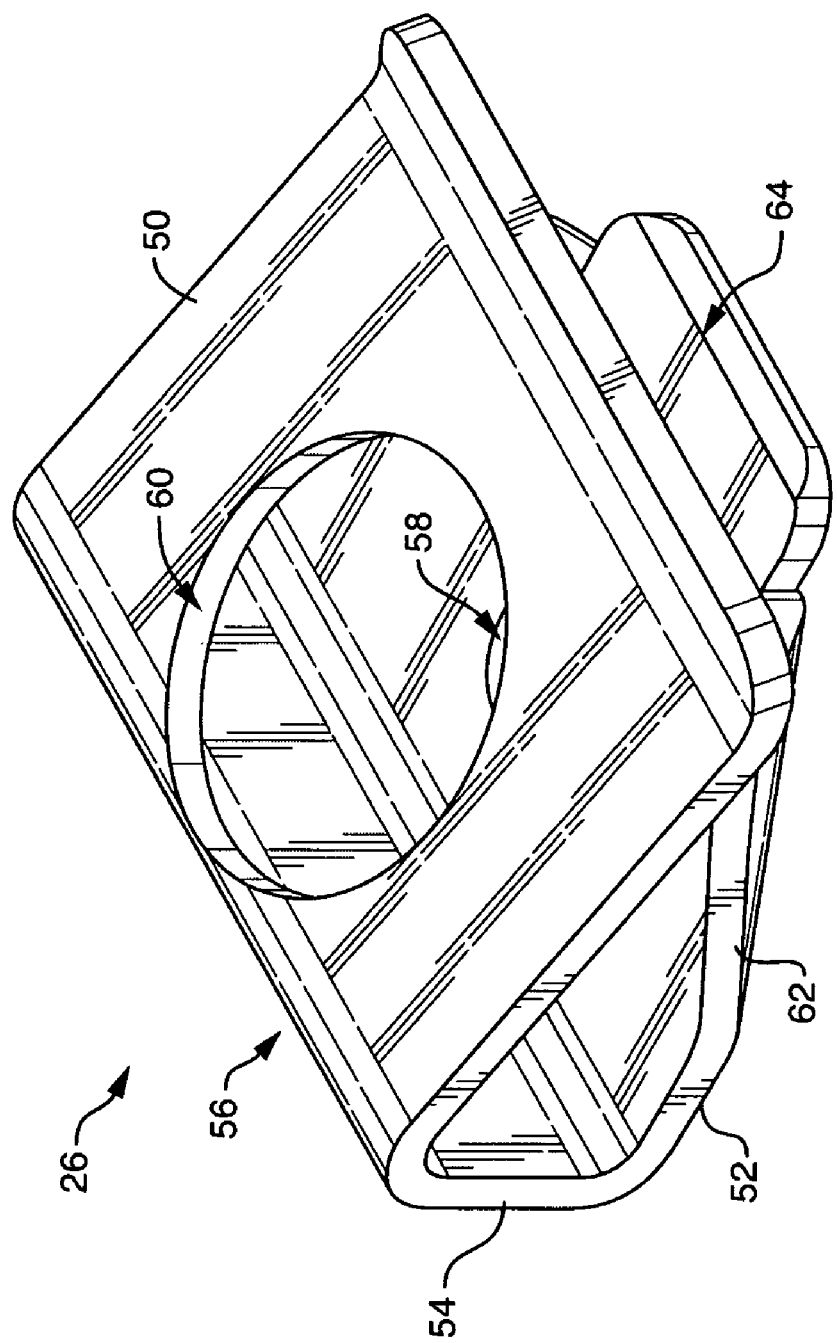
FIG. 2 is a perspective view of an edge clip of the electronic system.
Figure 3:
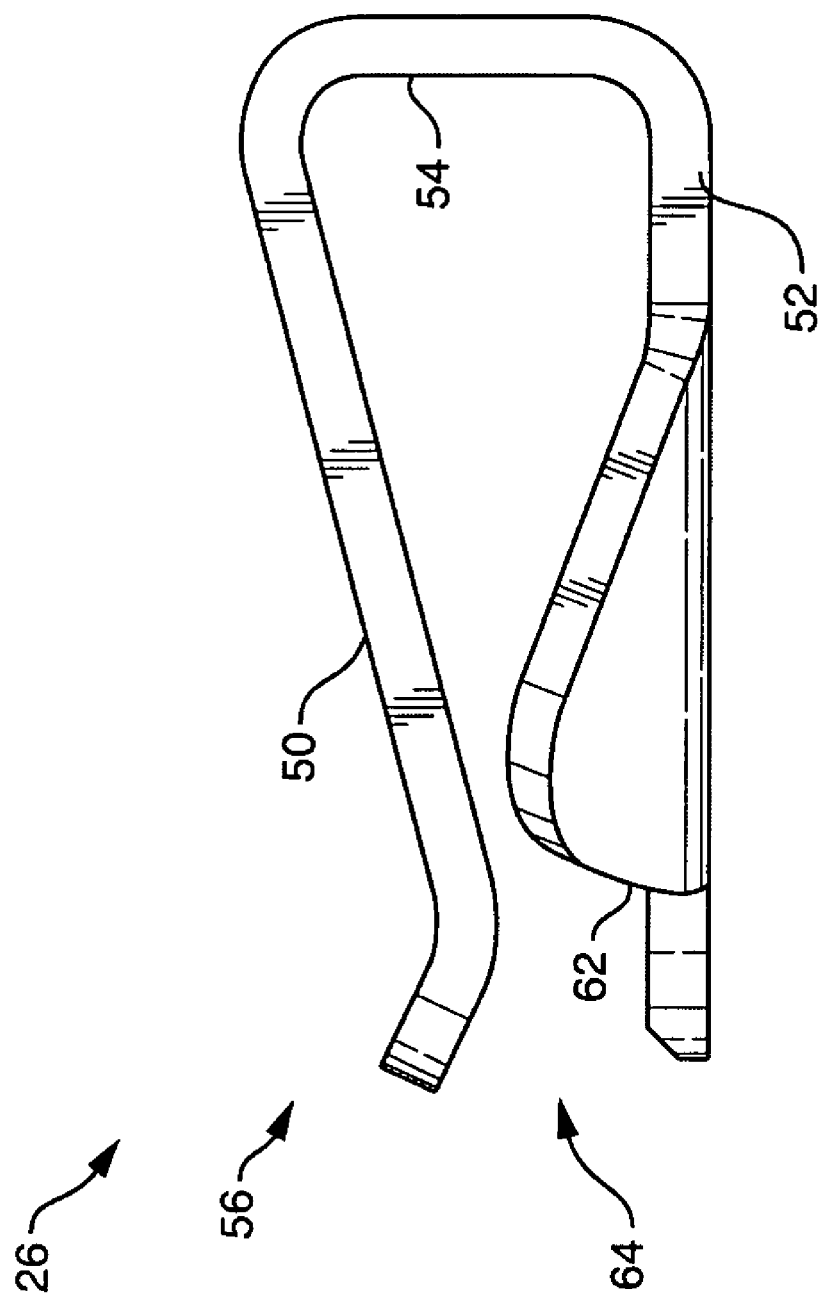
FIG. 3 is a side view of the edge clip of FIG. 2.
Figure 4:
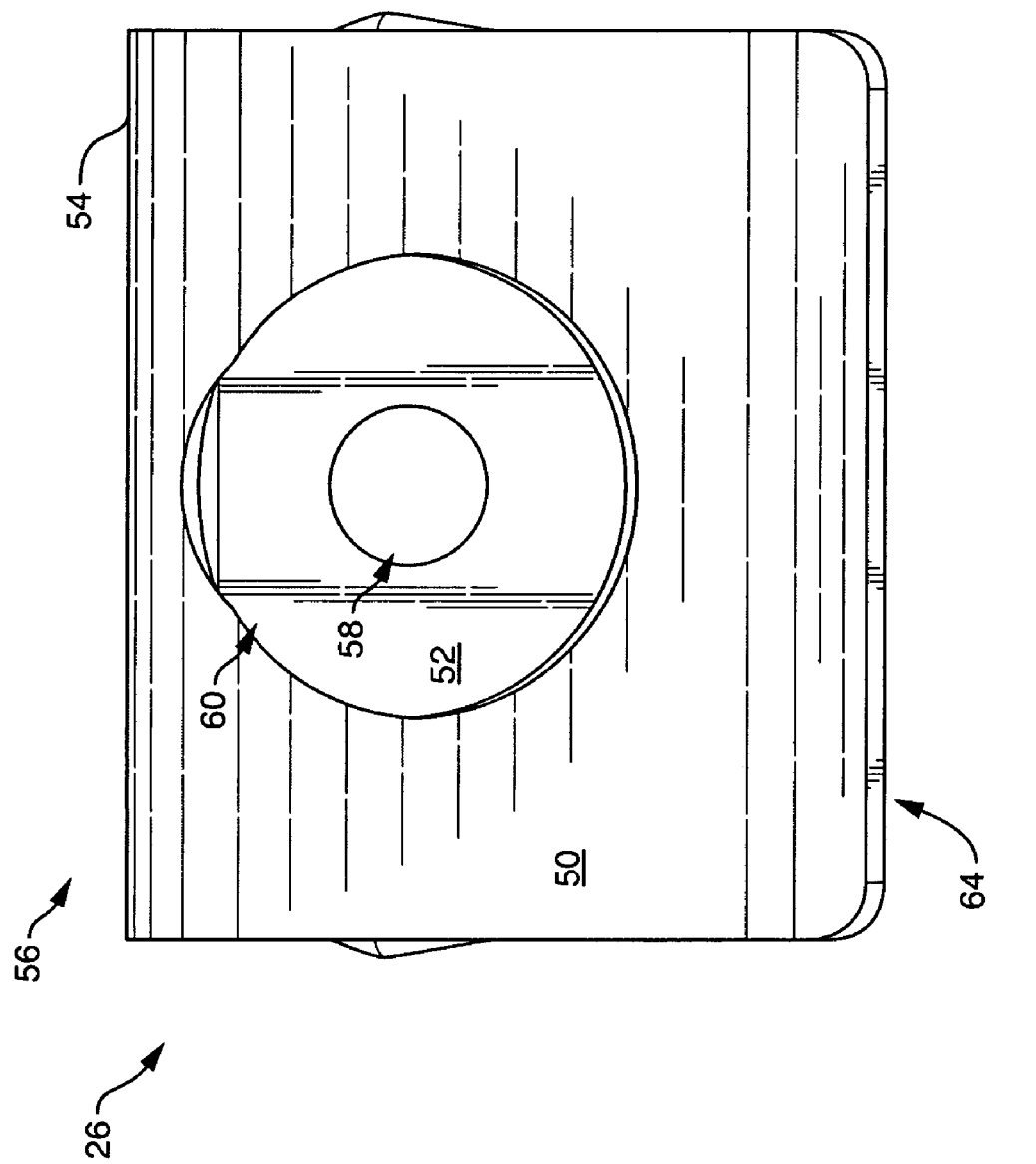
FIG. 4 is a top view of the edge clip of FIG. 2.
Figure 5:
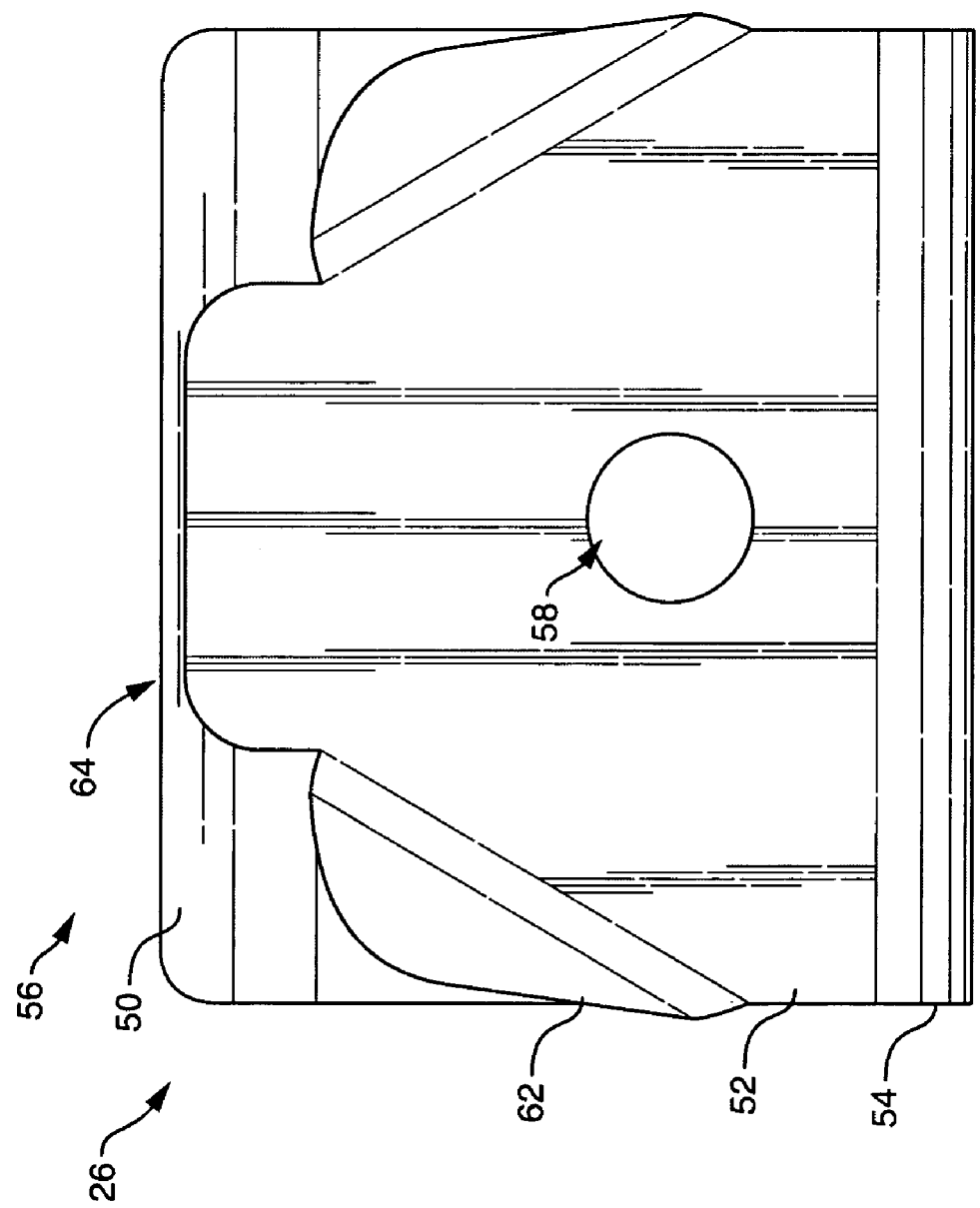
FIG. 5 is a bottom view of the edge clip of FIG. 2.
Figure 6:
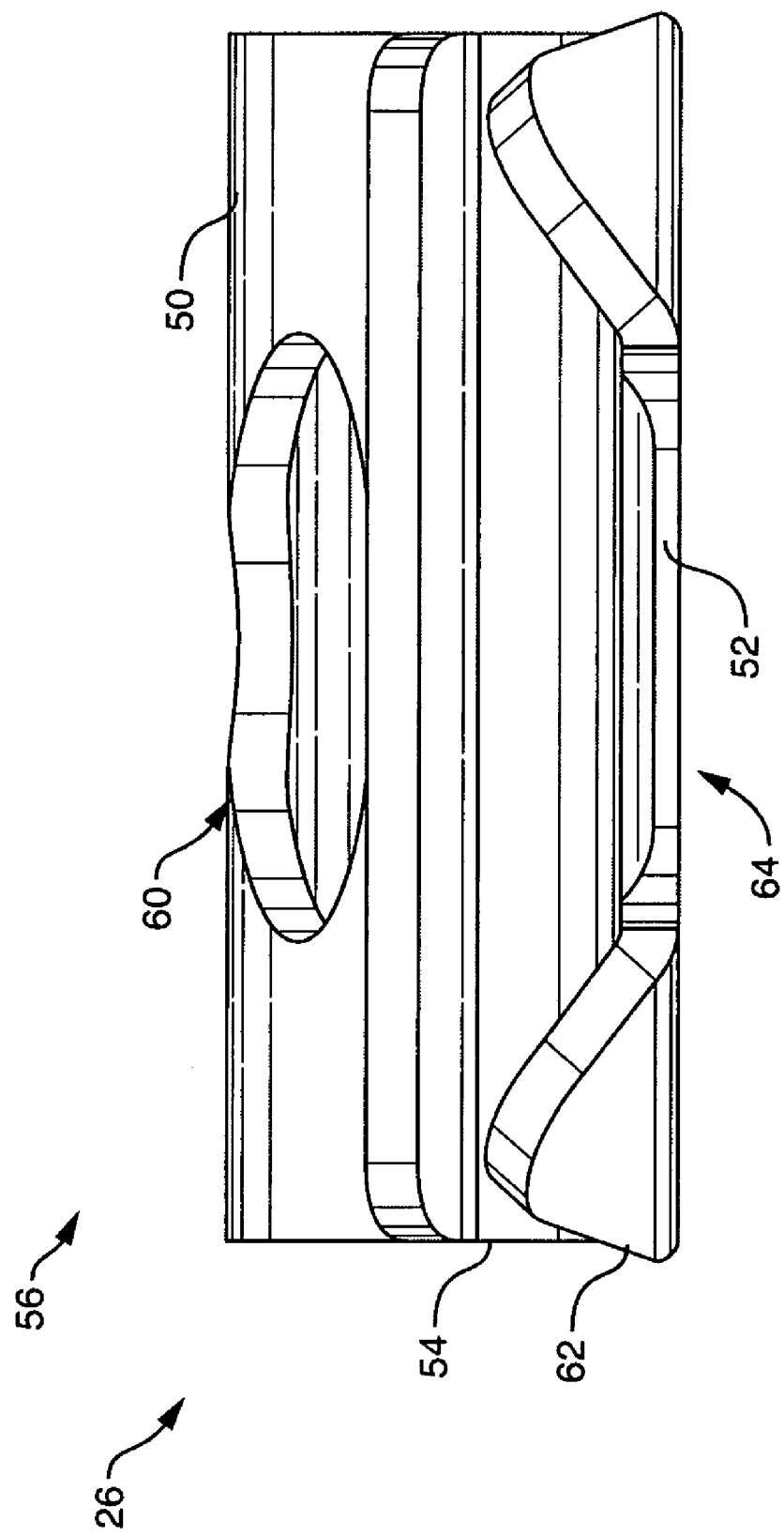
FIG. 6 is a front view of the edge clip of FIG. 2.

FIGS. 2 through 6 illustrate particular details of an edge clip 26 of the electronic system 20. FIG. 2 is a perspective view of the edge clip 26. FIG. 3 is a side view of the edge clip 26. FIG. 4 is a top view of the edge clip 26. FIG. 5 is a bottom view of the edge clip 26. FIG. 6 is a front view of the edge clip 26.

As shown in FIGS. 2 through 6, the edge clip 26 includes a top portion 50, a bottom portion 52, and a middle portion 54 connecting the top and bottom portions 50, 52 together. As best seen in FIG. 3, the top, bottom and middle portions 50, 52, 54 are integrated together to form a C-shaped unitary body 56 which fits around the outer edge 38 (FIG. 1) of the daughter board 24. In particular, resiliency of the C-shaped unitary body 56 enables the edge clip 26 to elastically compress around the outer edge 38 of the daughter board 24 with a predetermined spring force.

As best seen in FIGS. 4 and 5, the bottom portion 52 of the edge clip 26 defines a small diameter aperture 58 and the top portion 50 of the edge clip defines a large diameter aperture 60. Additionally, the heads of the screws 36 (FIG. 1) are small enough to pass through the aperture 60 but not the aperture 58. This situation enables a screw 36, when disposed substantially perpendicular to the motherboard plane and the daughter board plane (i.e., X-Y planes) to secure only to the bottom portion 52 of the edge clip 26 through the small diameter aperture 58 and not secure to the top portion 50 of the edge clip 26. As a result, there is no risk that the edge clips 26 will be inadvertently over-tightened resulting in damage to the daughter board 24.

As best seen in FIGS. 3 and 6, the bottom portion 52 defines a set of abutments 62 configured to abut the outer edge 38 of the daughter board 24 to limit an amount of wipe between the edge clip 26 and the daughter board 24 when the edge clip 26 fits around the outer edge 38 of the daughter board 24. As a result, a user installing an edge clip 26 along the outer edge of the daughter board 24 will not inadvertently slide the edge clip 26 too far onto the daughter board 24 and risk damaging a nearby circuit board structure (e.g., a mounted circuit board component).

It should be understood that, to facilitate installation of the edge clip 26, the top and bottom portions 50, 52 define a tapered opening 64 configured to engage the outer edge 38 of the daughter board 24. In one arrangement, the bottom portion 52 defines a 45 degree taper (from horizontal), and the top portion 50 defines a 20-30 degree taper from horizontal (also see FIG. 3).

It should be further understood that at least the bottom portion 52 includes metallic material (e.g., copper, nickel, steel, etc.) configured to provide part of an electrical grounding path from the daughter board 24 to the motherboard 22. In some arrangements, the entire C-shaped unitary body 56 is made of metal (e.g., stamped and bent from sheet metal stock). Further details will now be provided with reference to FIGS. 7 and 8.

Figure 7:
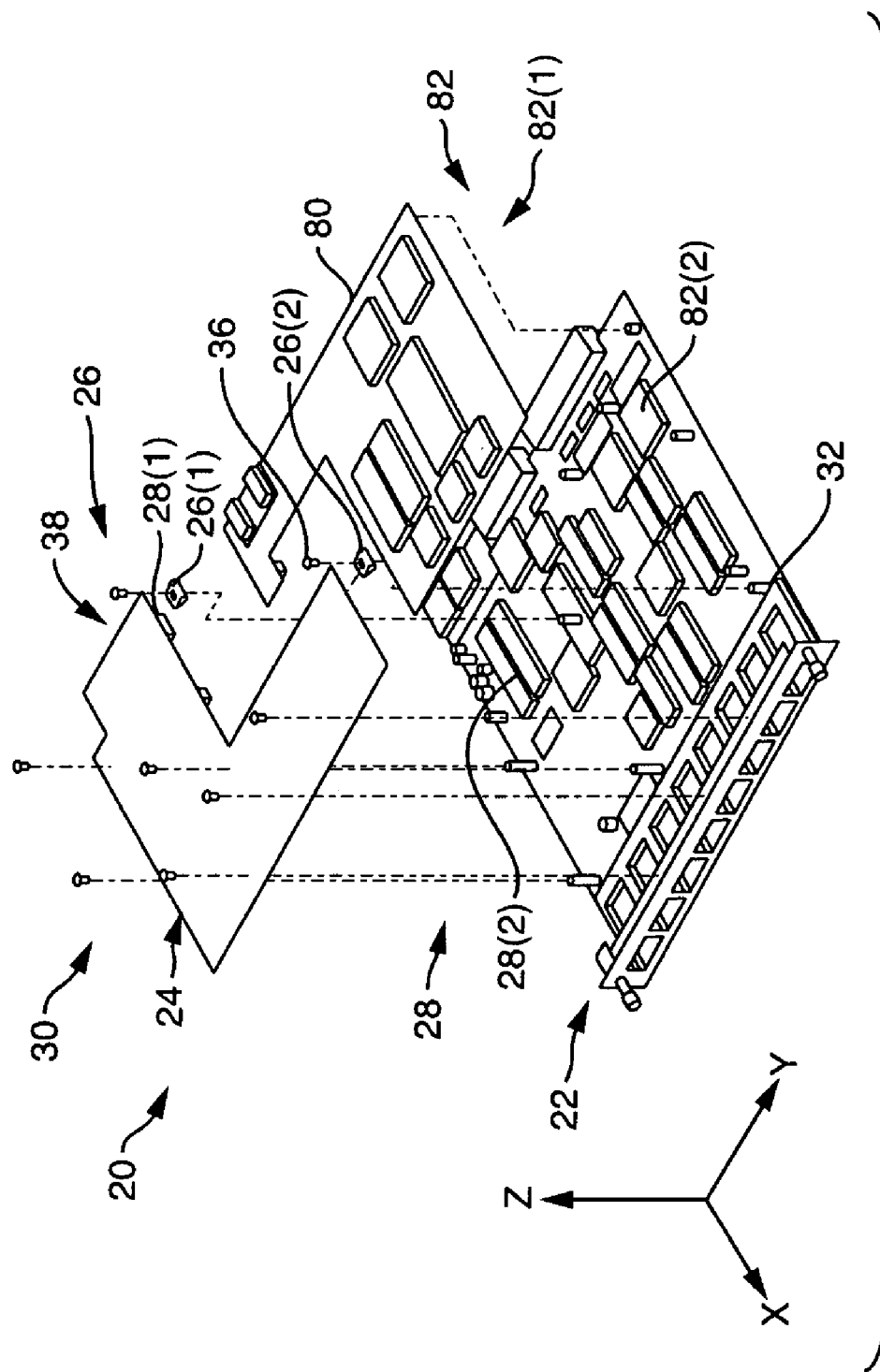
FIG. 7 is an exploded view of the electronic system of FIG. 1 with an additional circuit board included as an upgrade.
Figure 8:
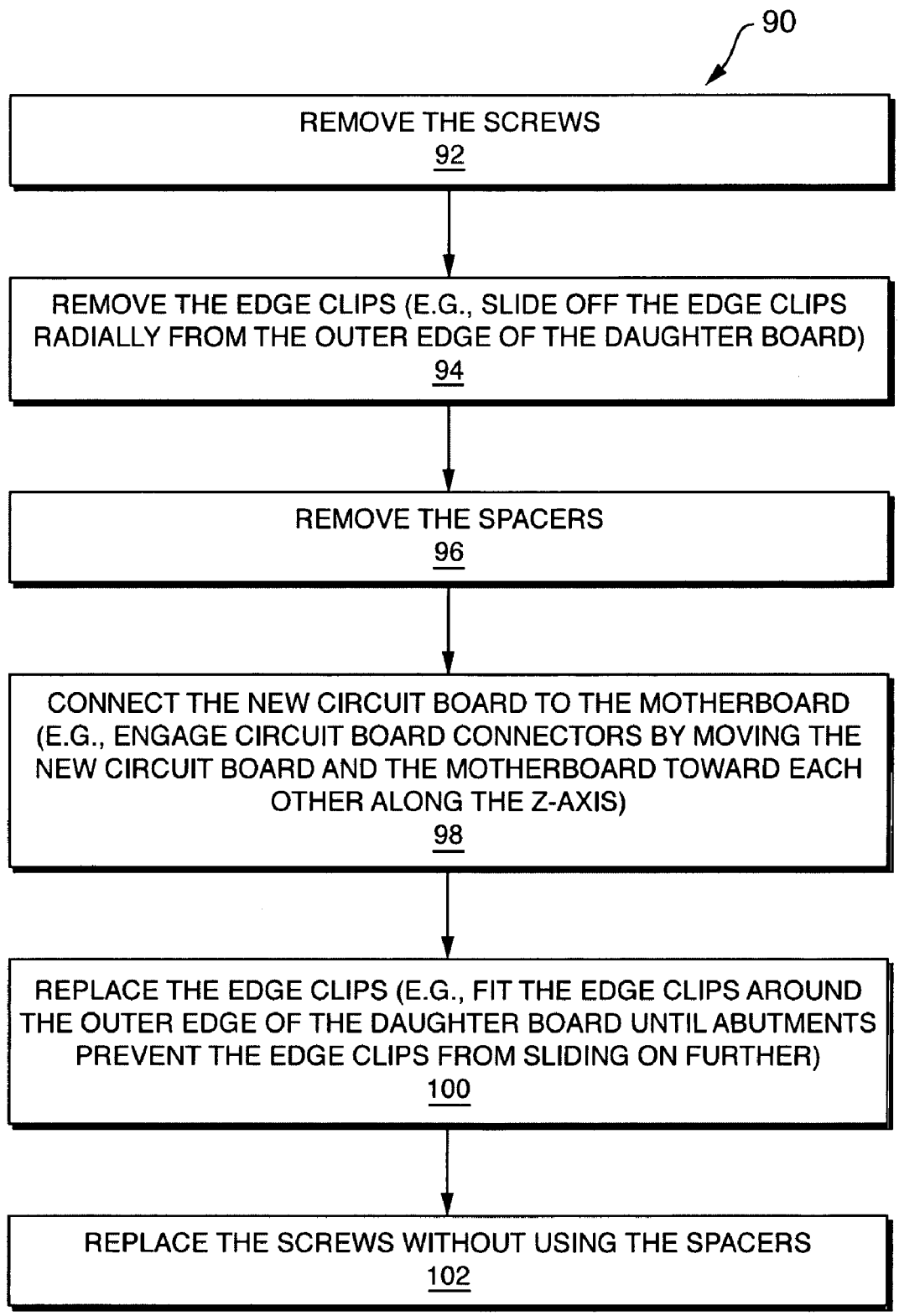
FIG. 8 is a flowchart of a procedure for upgrading the electronic system of FIG. 1.

FIG. 7 shows that the circuit board assembly 20 is upgradeable because a third circuit board 80 can be added to improve operation of the circuit board assembly 20 (e.g., to increase functionality, to increase processing power or throughput, etc.). FIG. 8 shows a flowchart of a procedure 90 for upgrading the circuit board assembly 20 to that shown in FIG. 7.

As shown in FIG. 7, the third circuit board 80 is configured electrically connect with the motherboard 22. In particular, a circuit board connector 82(1) (shown generally by the arrow 82(1) in FIG. 7) of the third circuit board 80 is configured to engage with a circuit board connector 82(2) of the motherboard 22 when the third circuit board 80 and the motherboard 22 move toward each other along an axis (i.e., the Z-axis) which is substantially perpendicular to the motherboard plane and the third circuit board plane (i.e., X-Y planes). However, due to the locations of the edge clips 26 and the geometries of the daughter board 24 and the third circuit board 80, the edge clips 26 may prevent the circuit board connectors 82(1), 82(2) (collectively, circuit board connectors 82) from initially electrically connect with each other. Such a situation may exist if the third circuit board 80 is a pre-existing product (e.g., a legacy board) and the manufacturer wishes to utilize this pre-existing product on a newly designed circuit board assembly. Fortunately, the user does not need to entirely remove the daughter card 24 from the motherboard 22. Rather, the user can simply maneuver the hardware 30 in a manner than allows the third circuit board 80 to connect to the motherboard 22.

FIG. 8 shows the procedure 90 which is performed by a user when installing the third circuit board 80 to upgrade the circuit board assembly 20. In step 92, the user removing the set of screws 36. In step 94, the user removes the set of edge clips 26, (i.e., the user slides each edge clip 26 radially from the outer edge 38 of the daughter board 24). In step 96, the user removes the set of spacers 34. At this point, the third circuit board 80 is capable of connecting with the motherboard 22 along the Z-axis (FIG. 7) without any interference. The spacers 34 can be discarded since they are not used to holding the third circuit board 80 in place.

In step 98, the user connects the third circuit board 80 which defines an X-Y plane with the motherboard 22. In particular, the user moves the third circuit board 80 and motherboard toward each other (i.e., along the Z-axis in FIG. 7) so that the circuit board connectors 82 robustly engage each other. At this point, the third circuit board 80 sits at a position which is closer to the motherboard 22 than the daughter board 24. That is, the distance between the third circuit board 80 and the motherboard 22 is smaller than the distance between the daughter board 24 and the motherboard 22.

In step 100, the user replaces the set of edge clips 26 (i.e., the user fits each edge clip 26 around the outer edge 38 of the daughter board 24 to compress that edge clip 26 around the outer edge 38 of the daughter board 24). Preferably, the user pushes the edge clips 26 until the abutments 62 prevent the edge clips 26 from moving further onto the daughter board 24.

In step 102, the user replaces the set of screws 36. At this point, the set of screws 36 passes through the set of edge clips 26, the third circuit board 80 and the set of standoffs 32 to position the motherboard 22, the daughter board 24 and the third circuit board 80 relative to each other so that the motherboard plane, the daughter board plane and the third circuit board plane are substantially parallel to each other. As a result, the circuit board assembly 20 is now upgraded and the user did not need to disconnect the daughter board 24 from the motherboard 22 during the upgrade process. Nevertheless, the same screws 36 hold the motherboard 22, the daughter board 24 and the third circuit board 80 together in a reliable manner.

It should be understood that the use of the edge clips 26 enable the manufacturer to avoid providing tabbed portions of circuit board material, as mounting platforms, on the daughter board 24. Accordingly, there is little waste of circuit board material and the ability for the manufacturer to increase the number of daughter boards 24 on each panel during the circuit board fabrication process. As a result, the manufacturer increases the yield of daughter boards 24 per panel.

As described above, an improved circuit board assembly 20 utilizes a set of edge clips 26 which extend outwardly from a daughter board 24 connected to a motherboard 22. The set of edge clips 26 enable a user to connect a new circuit board 80 to the motherboard 22 on the same side as the daughter board 24 without removing the daughter board 24 even if the distance from the new circuit board 80 to the motherboard 22 is smaller than the distance from the daughter board 24 to the motherboard 22. Accordingly, there is no need to disconnect the daughter board 24 from the motherboard 22 and then reconnect the daughter board 24 to the motherboard 22 which could otherwise run the risk of damaging one or both of the boards 22, 24. Rather, during installation of the new circuit board 80 onto the motherboard 22, the daughter board 24 can remain connected at all times using circuit board connectors 28.

While this invention has been particularly shown and described with references to preferred embodiments thereof, it will be understood by those skilled in the art that various changes in form and details may be made therein without departing from the spirit and scope of the invention as defined by the appended claims.

What is claimed is:

1. A circuit board assembly, comprising:
   a motherboard defining a motherboard plane;
   a daughter board defining a daughter board plane and including an outer edge, the motherboard and the daughter board being electrically connected through a set of circuit board connectors; and
   a set of edge clips, each edge clip including a top portion, a bottom portion and a middle portion, the bottom portion having a first and a second abutment extending from either side thereof, the first and second abutments acting as a stop to limit the position of the edge clip relative to the edge of the daughter board during insertion of the daughter board within the edge clips, the set of edge clips extending outwardly from the daughter board along the daughter board plane and being configured to operate as a mounting platform through which to physically secure the daughter board to the motherboard.

2. A circuit board assembly as in claim 1 wherein the middle portion of the clip connects the top and bottom portions together, the top, bottom and middle portions being integrated together to form a C-shaped unitary body which fits around an outer edge of the daughter board.

3. A circuit board assembly as in claim 2 wherein, for each edge clip, resiliency of the C-shaped unitary body of that edge clip enables that edge clip to compress around the outer edge of the daughter board with a predetermined spring force.

4. A circuit board assembly as in claim 3 wherein, for each edge clip, the bottom portion of that edge clip defines a small diameter aperture and the top portion of that edge clip defines a large diameter aperture to enable a screw to pass through only the large diameter aperture so as to secure only to the bottom portion of that edge clip through the small diameter aperture and not secure to the top portion of that edge clip.

5. A circuit board assembly as in claim 2 wherein, for each edge clip, the bottom portion resides closer to the motherboard than the top portion, and the bottom portion includes metallic material configured to provide part of a grounding path from the daughter board to the motherboard.

6. A circuit board assembly as in claim 2 wherein a connector of the daughter board is configured to engage with a connector of the motherboard when the daughter board and the motherboard move toward each other along an axis.

7. A circuit board assembly as in claim 2 wherein the set of edge clips includes a first edge clip and a second edge clip; and wherein the circuit board assembly further comprises:
   first mounting hardware configured to mount the first edge clip to the motherboard, and
   second mounting hardware configured to mount the second edge clip to the motherboard.

8. A circuit board assembly as in claim 7 wherein the first mounting hardware includes:
   a first standoff, a first spacer and a first screw configured to pass through the bottom portion of the first edge clip, the first spacer and the first standoff when mounting the first edge clip to the motherboards, the first standoff and the first spacer defining a preset separation distance between the motherboard and the daughter board; and
   wherein the second mounting hardware includes:

a second standoff, a second spacer and a second screw configured to pass through the bottom portion of the second edge clip, the second spacer and the second standoff when mounting the second edge clip to the motherboard, the second standoff and the second spacer defining the preset separation distance between the motherboard and the daughter board.

9. A circuit board assembly as in claim 7, further comprising:
a third circuit board defining a third circuit board plane;
wherein the first mounting hardware includes:
a first standoff and a first screw configured to pass through the bottom portion of the first edge clip, the third circuit board and the first standoff;
wherein the second mounting hardware includes:
a second standoff and a second screw configured to pass through the bottom portion of the second edge clip, the third circuit board and the second standoff;
wherein the daughter board is a daughter board distance from the motherboard;
wherein the third circuit board is a third circuit board distance from the motherboard; and
wherein the daughter board distance is greater than the third circuit board distance.

10. A circuit board assembly as in claim 9 wherein a connector of the third circuit board is configured to engage with a connector of the motherboard when the third circuit board and the motherboard move toward each other along an axis.

11. A circuit board assembly as in claim 1 wherein, for each edge clip, the top and bottom portions define a tapered opening configured to engage the outer edge of the daughter board.

12. A circuit board assembly as in claim 1 wherein the first and second abutments extend upward from the bottom portion toward the top portion of the edge clip.

13. A circuit board assembly as in claim 1 wherein the top and bottom portions of each edge clip defines a tapered opening configured and dimensioned to releasably secure the edge of the daughter board therebetween, and wherein the bottom portion further includes an aperture configured and dimensioned to receive a fastener therethrough so as to secure the bottom portion to the motherboard when mounted, the bottom portion of the edge clip operating to secure both the daughter and the motherboard.

14. A circuit board assembly, comprising:
a motherboard defining a motherboard plane;
a daughter board defining a daughter board plane including an outer edge,
means for electrically connecting the motherboard and the daughter board together, and
a set of edge clips, each edge clip extending outwardly from the daughter board along the daughter board plane and being configured to operate as a mounting platform through which to physically secure the daughter board to the motherboard, each edge clip further including means extending from a bottom portion of the edge clip for limiting an amount of wipe between that edge clip and the daughter board when the edge clip is positioned around the outer edge of the daughter board, the means extending from the bottom portion of the edge clip also limiting the distance the daughter board can be inserted within the edge clip.

15. A circuit board assembly as in claim 14 wherein each edge clip includes:
means for fastening around an outer edge of the daughter board with a predetermined spring force.

16. A method for upgrading a circuit board assembly having (i) a motherboard defining a motherboard plane, (ii) a daughter board defining a daughter board plane, (iii) a set of edge clips outwardly extending from the daughter board, (iv) a set of spacers, (v) a set of standoffs and (vi) a set of screws passing through the set of edge clips, spacers and standoffs to initially position the motherboard and the daughter board relative to each other, the method comprising:
removing the set of screws;
removing the set of edge clips;
removing the set of spacers;
connecting a third circuit board with the motherboard, the third circuit board defining a third circuit board plane;
replacing the set of edge clips by pushing each edge clip around the outer edge of the daughter board so as to compress that edge clip around the outer edge of the daughter board until abutments of that edge clip act as a stop to prevent that edge clip from moving further onto the daughter board, and
replacing the set of screws so that the set of screws passes through the set of edge clips, the third circuit board and the set of standoffs to position the motherboard, the daughter board and the third circuit board relative to each other.

17. A method as in claim 16 wherein connecting the third circuit board with the motherboard includes:
moving the third circuit board and the motherboard toward each other along an axis to engage a connector of the third circuit board with a connector of the motherboard.

18. A method as in claim 17 wherein removing the set edge clip includes:
sliding each edge clip radially from an outer edge of the daughter board.

19. An edge clip for mounting a daughter board to a motherboard, the edge clip consisting essentially of:
a unitary body including:
a top portion including a first aperture disposed therein, the first aperture having a first diameter;
a bottom portion including a second aperture disposed therein, the second aperture having a second diameter being smaller than the first diameter, the bottom portion further including a first and a second abutment extending from either side of the bottom portion;
a middle portion connecting the top portion to the bottom portion; and
wherein the first and second abutments are constructed and arranged to limit the distance the edge of the daughter board can be inserted within the clip during mounting the daughter board to the motherboard and wherein the first and second abutments further limit an amount of wipe between the edge clip and the daughter board upon mounting the daughter board within the clip.

* * * * *